United States Patent [19]

Bartholomew et al.

[11] Patent Number: 5,136,975

[45] Date of Patent: Aug. 11, 1992

[54] INJECTOR AND METHOD FOR DELIVERING GASEOUS CHEMICALS TO A SURFACE

[75] Inventors: Lawrence D. Bartholomew; Kenneth M. Provancha; George Kamian; Jay B. DeDontney; Gregory M. McDaniel, all of Santa Cruz County, Calif.

[73] Assignee: Watkins-Johnson Company, Palo Alto, Calif.

[21] Appl. No.: 542,243

[22] Filed: Jun. 21, 1990

[51] Int. Cl.$^5$ .............................................. C23C 16/00
[52] U.S. Cl. ..................................... 118/715; 118/725
[58] Field of Search .............................. 118/715, 725

[56] References Cited

U.S. PATENT DOCUMENTS

| | | | |
|---|---|---|---|
| 4,351,267 | 9/1982 | Kalbskopf | 118/718 |
| 4,361,284 | 11/1982 | Kalbskopf | 118/718 |
| 4,446,815 | 5/1984 | Kalbskopf | 118/718 |
| 4,792,378 | 12/1988 | Rose | 118/728 |
| 4,834,020 | 5/1989 | Bartholomew | 118/725 |

FOREIGN PATENT DOCUMENTS

| | | | |
|---|---|---|---|
| 60-98629 | 6/1985 | Japan | 156/345 |
| 63-187619 | 8/1988 | Japan | 118/723 |

*Primary Examiner*—Richard Bueker
*Attorney, Agent, or Firm*—Flehr, Hohbach, Test, Albritton & Herbert

[57] ABSTRACT

What is disclosed is an injector of the type commonly used in atmospheric pressure chemical vapor deposition equipment. The injector includes a number of plates with a number of linear hole arrays. The plates are layered in order to produce a number of cascaded holes arrays. The layered plates define a hole matrix. A chute is positioned beneath the hole matrix. On both sides of the chute is a cooling plate. The chute includes a passage, the regions between the cooling plate and the chute form ducts. The top of the hole matrix receives a number of gases and discretely conveys them to the top of the individual cascaded hole arrays. The gaseous chemicals are then forced through the cascaded hole arrays which induces the gases to flow in an increasingly uniform manner. The gases are then individually fed to the passage and ducts which convey them to a region above the surface where the gases are exposed to one another, react and form a layer on the surface.

15 Claims, 10 Drawing Sheets

INJECTOR AND METHOD FOR DELIVERING GASEOUS CHEMICALS TO A SURFACE

BRIEF DESCRIPTION OF THE INVENTION

This invention relates to an injector and method for discretely delivering gaseous chemicals to an area above a surface where the gases mix, react and form a layer on the surface. More particularly, it relates to an injector and method for uniformly depositing films or layers to a surface of a wafer or substrate in conjunction with an atmospheric pressure chemical vapor deposition apparatus.

BACKGROUND OF THE INVENTION

An apparatus for producing films or layers on substrates or wafers by conveyorized atmospheric pressure chemical vapor deposition (APCVD) is described in U.S. Pat. No. 4,834,020 and owned by assignee. This patent is expressly incorporated herein by reference.

In general, the APCVD apparatus includes a conveyor belt which transports a wafer or substrate through one or more coating chambers. Each coating chamber includes an injector for creating and maintaining a chemical vapor atmosphere at the wafer or substrate surface such that a reaction occurs between the chemical vapors or between the chemical vapors and the wafer or substrate. The reaction byproducts form a layer on the wafer or substrate to produce a layer or film.

An important element in creating and maintaining the chemical vapor atmosphere at the wafer surface is the injector. The injector receives a number of gases and discretely conveys them to the area above the surface of the wafer or substrate where they mix, react and then form a layer on the wafer or substrate.

The gases must be uniformly mixed over the surface of the wafer or substrate in order to provide a proper chemical reaction. When the gases are not uniformly delivered, they do not mix properly. Thus, the chemical reaction that transpires is one with undesirable chemical concentrations. Consequently, defective films or coatings are deposited on the wafers or substrates. Therefore, to insure a proper film or coating, the gases must be introduced substantially uniformly.

To achieve an advance in the art of depositing a film or coating on a wafer or substrate it is important to refine the apparatus and method of delivering gaseous chemicals to a wafer or substrate. This largely involves refining the means for achieving a uniform, or laminar, flow of reaction chemicals. The prior art has met with limited success in achieving such a uniform flow of reaction chemicals.

OBJECTS AND SUMMARY OF THE INVENTION

It is an object of this invention to provide a method and apparatus for delivering gaseous chemicals to a surface.

It is a more particular object of this invention to provide a method and apparatus for use within an atmospheric chemical vapor deposition apparatus, for delivering gaseous chemicals to the surface of a wafer or substrate in order to deposit a film or layer on the surface.

Another object of this invention is to provide a method and apparatus for improving the uniformity in which individual gaseous chemicals are delivered.

A related object of this invention is to provide a method and apparatus for improving the quality of films or layers deposited on wafers or substrates.

These and other objects are achieved by an injector with a number of stacked plates with each plate including a number of linear hole arrays. The stacked plates produce a number of cascaded hole arrays. A chute surrounded by a cooling plate is positioned beneath the last hole array. The chute includes a central passage and the regions between the cooling plate and the chute form ducts. The top plate receives a number of gases and discretely conveys them to the top of the individual cascaded hole arrays. The gaseous chemicals are then forced through the cascaded hole arrays which induces the gases to flow in an increasingly uniform manner. The gases are then individually fed to the chute passage and ducts which convey them to a region above the surface where the gases are mixed, react, and form a layer on the surface of an underlying substrate.

BRIEF DESCRIPTION OF THE DRAWINGS

Other objects and advantages of the invention will become apparent on reading the following detailed description and upon reference to the drawings, in which.

DETAILED DESCRIPTION OF THE INVENTION

Figure 1:
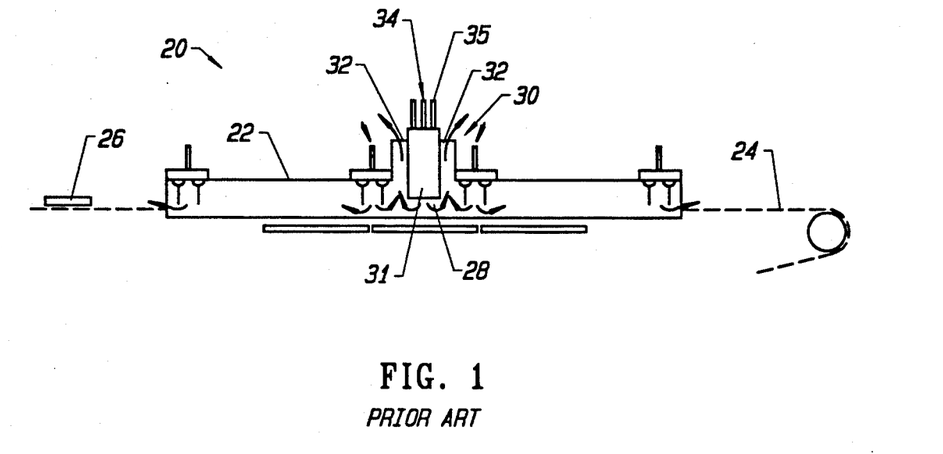
FIG. 1 is a schematic cross-sectional view of an atmospheric chemical vapor deposition apparatus in accordance with the prior art.

Turning now to the drawings, wherein like components are designated by like reference numerals in the various figures, attention is initially directed to FIG. 1. The figure represents a schematic cross-sectional view of an atmospheric pressure chemical vapor deposition apparatus 20. The apparatus 20 includes a muffle 22 and a conveyor belt 24. The conveyor belt 24 delivers a substrate or wafer 26 into the muffle 22 which includes a coating chamber 28.

The wafer or substrate 26 moves along the conveyor belt 24 into the muffle 22 toward and through the coating chamber 28. In the coating chamber 28, the chemical delivery system 34 produces a chemical vapor atmosphere. The chemical delivery system 34 includes a number of delivery lines 35 which individually convey gaseous chemicals (gases or vapors) to the injector assembly 31. The vapor atmosphere produced by the chemical delivery system 34 is cleared by the exhaust system 30 which includes a number of exhaust lines 32.

As the wafer or substrate 26 passes through the chemical vapor atmosphere within the coating chamber 28, a reaction between the individual vapors occurs, or a reaction between the individual vapors and the wafer or substrate 26 occurs. In either case, a film or layer is deposited on the wafer or substrate 26 as a result of the reaction. In order to realize a uniform film or layer on the wafer or substrate, the injector 31 must generate a uniform flow for the different gases and then mix those gases in a uniform manner.

Figure 2:
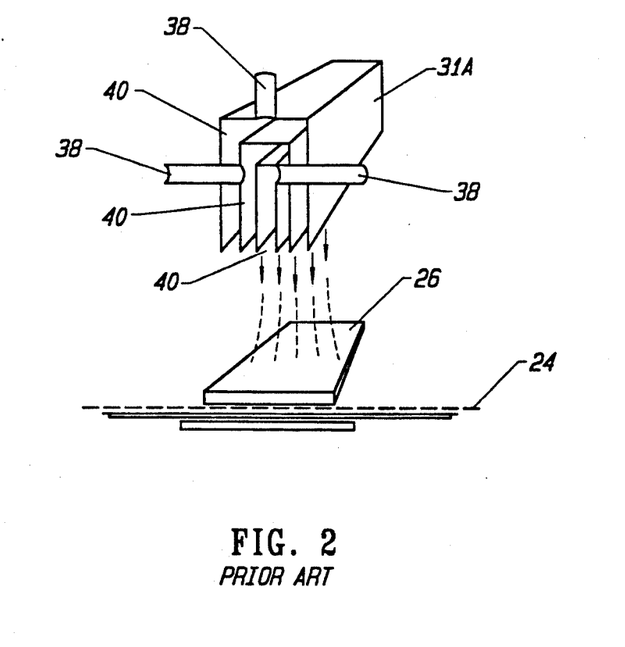
FIG. 2 is a side view of a prior art chemical vapor injector.

A prior art approach to realizing these objectives is depicted in FIG. 2. An injector 31A includes several conduits 38 which discretely convey gaseous chemicals. Each conduit leads to a chamber 40 where the gases diffuse, but remain separated. The gases are force to the bottom of each of the chambers 40 where they are free to interact with one another and the wafer or substrate 26, resulting in a film or layer on the wafer or substrate 26. As can be appreciated from the figure, the conduits 38 feeding the expansive chambers 40 with gases provide inadequate flow control to insure a uniform chemical reaction when the gases eventually meet above the wafer or substrate 26.

Figure 3:
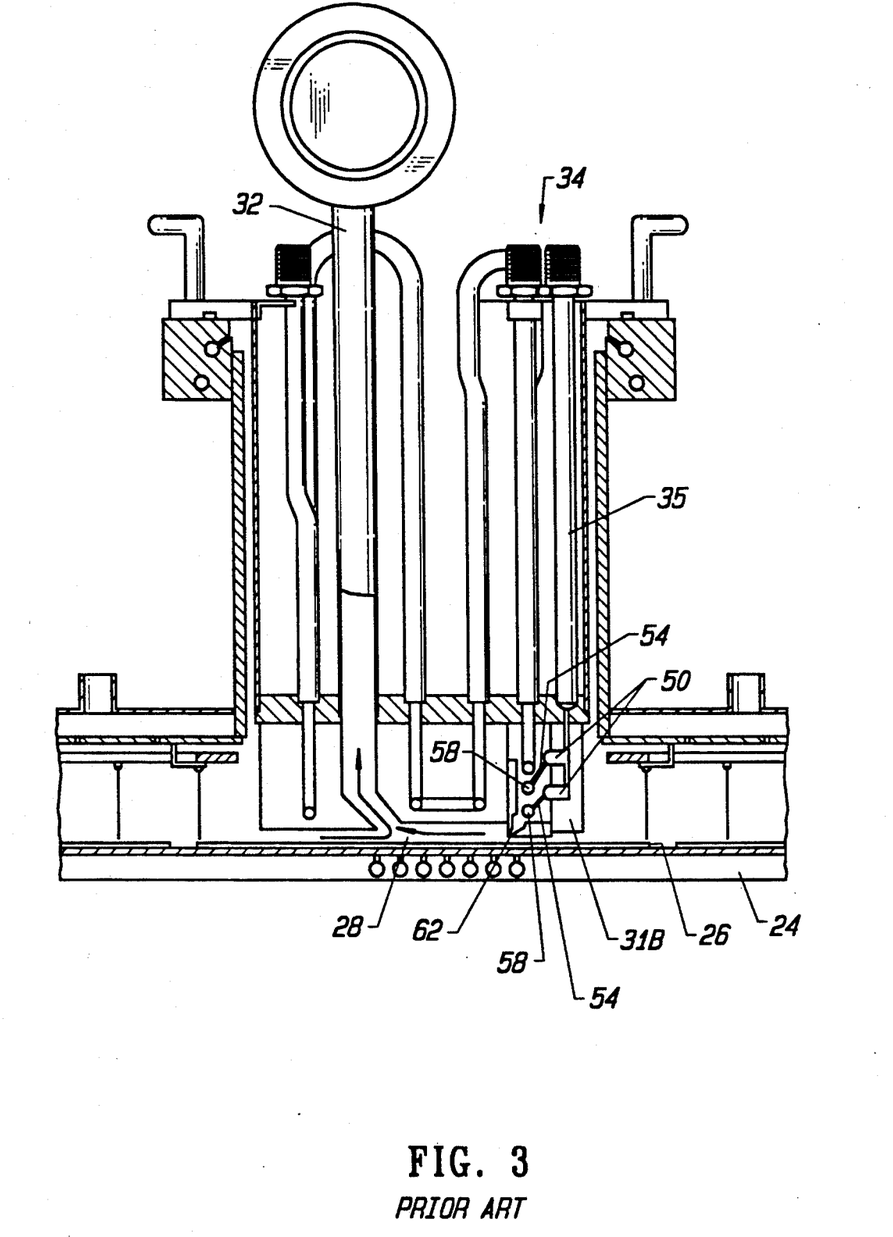
FIG. 3 is a cross-sectional view of another prior art chemical vapor injector.

This prior art problem was alleviated by the prior art approach depicted in FIG. 3. The figure depicts a chemical delivery system 34 including delivery lines 35 and an injector 31B. The injector includes primary distribution plenums 50 which lead to openings 54. In turn, the openings 54 lead to secondary plenums 58 which then lead to ports 62. The gases interact after they leave ports 62. This approach lends itself to enhanced uniform flow control of gases. On the other hand, flow control can be improved.

Figure 4:
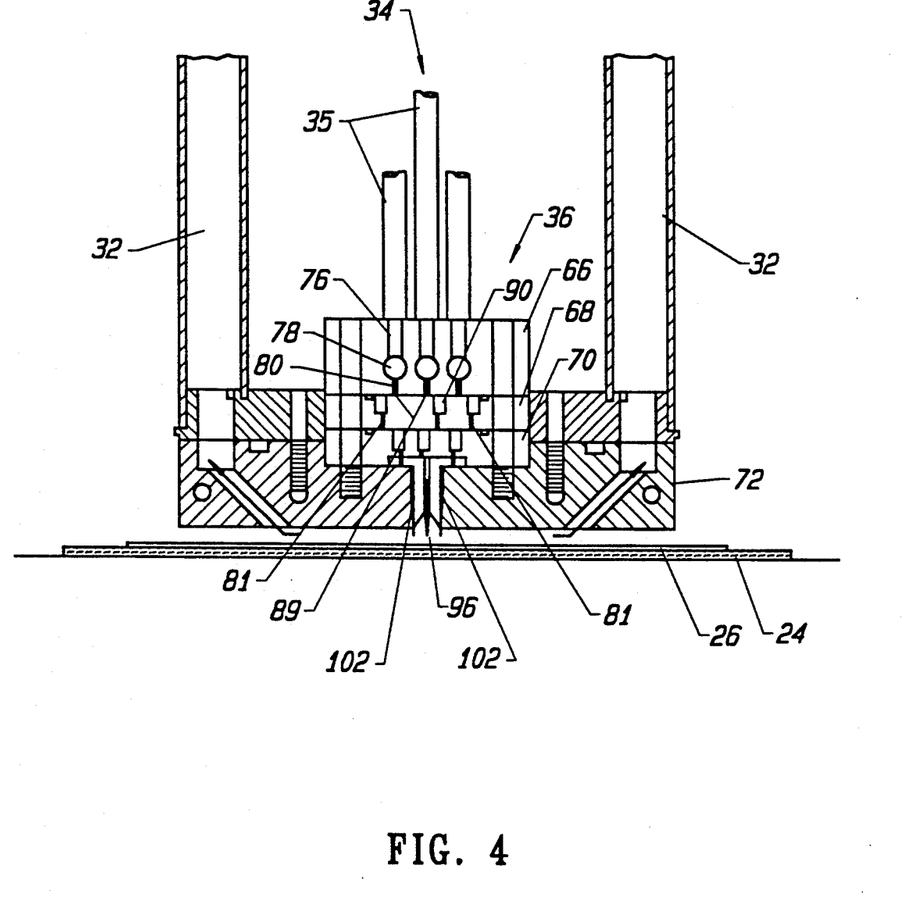
FIG. 4 is a cross-sectional view of the injector of this invention.

The injector of the present invention is depicted in FIG. 4. The chemical delivery lines 35 of the chemical delivery system 34 lead to the injector 36. In the present embodiment, the injector 36 includes stacked plates, a top (first) plate 66, middle (second) plate 68, and a bottom (third) plate 70. Positioned beneath the bottom plate 70 is a chute 96. A cooling plate 72 surrounds the chute 96. The region between the chute 96 and the cooling plate 72 defines ducts 102. Preferably, the injector is constructed of aluminum.

It is noted that the width of the chute 96 is depicted in FIG. 4 as being above only a small portion of the wafer 26. On the other hand, a view along the length of the injector would depict that the chute 96 in that dimension extends across the entire wafer 26.

Figure 5:
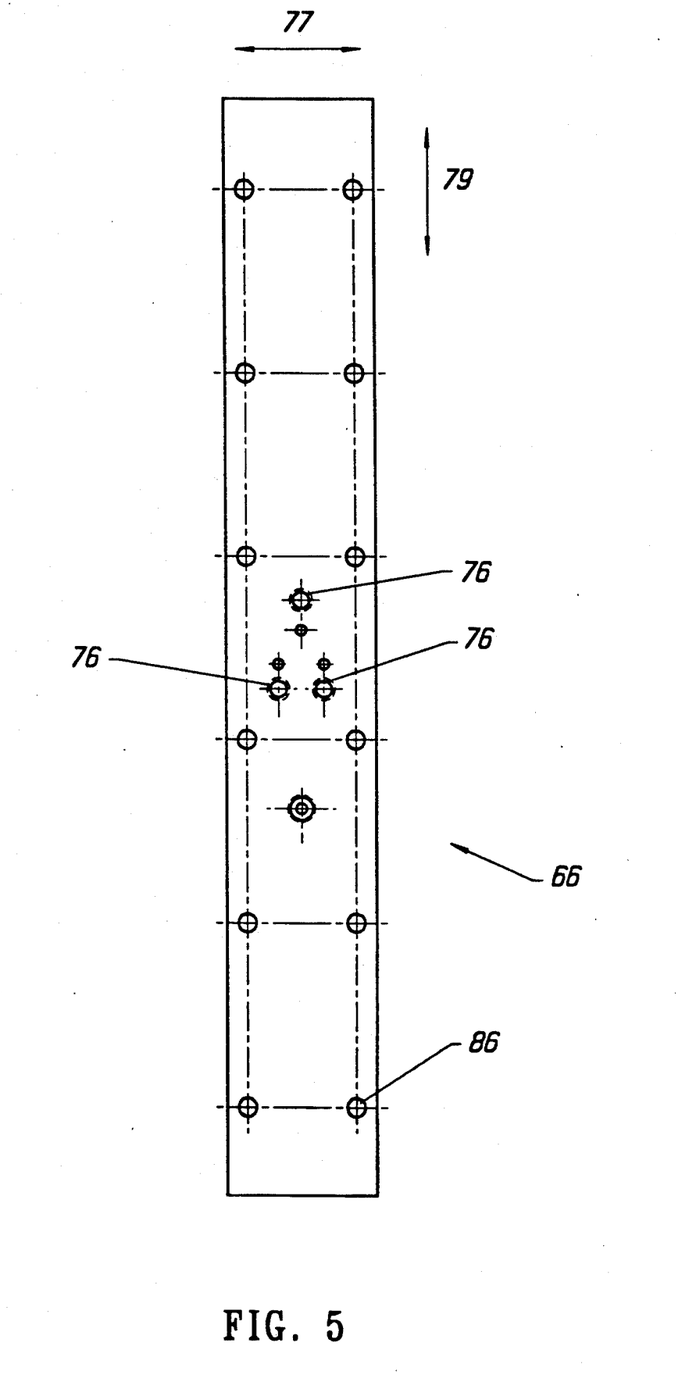
FIG. 5 is a plan view of the top surface of the top plate of the injector shown in FIG. 4.

The details of the various plates which comprise the injector will now be described. Turning to FIG. 5, depicted therein is the top surface of the top plate 66. Arrow 77 indicates the width of the plate, while arrow 79 indicates its length. In this embodiment, the top plate 66 includes three input passages 76. A chemical delivery line 35 is attached to each passage 76, as can be appreciated by referring to FIG. 4. The plate also includes several fastener receiving holes 86, which are used to connect the stacked plates to one another.

The dimensions may vary, but in this embodiment the first plate 66 is approximately 15 inches in length and approximately 2 inches in width. The plate is approximately 0.72 inches deep. The conduits 76 are approximately 0.272 inches in diameter. The fastening holes 82 are approximately 0.218 inches in diameter.

The passages 76 of the top plate 66 individually lead to plenums 78 where the gases spread lengthwise, as can be appreciated with reference to FIG. 4. The plenums 78 feed individual linear hole arrays 80. The nature of the linear hole arrays may be appreciated with reference to FIG. 6. The figure depicts the bottom surface of the top plate 66 which, in this embodiment, includes three linear hole arrays 80, running along the length of the plate, and each communicating with a plenum 78. In this embodiment, each hole 85 of the linear hole array 80 is approximately 0.052 inches in diameter. Each of the three linear hole arrays 80 includes 11 holes 85.

Figure 6:
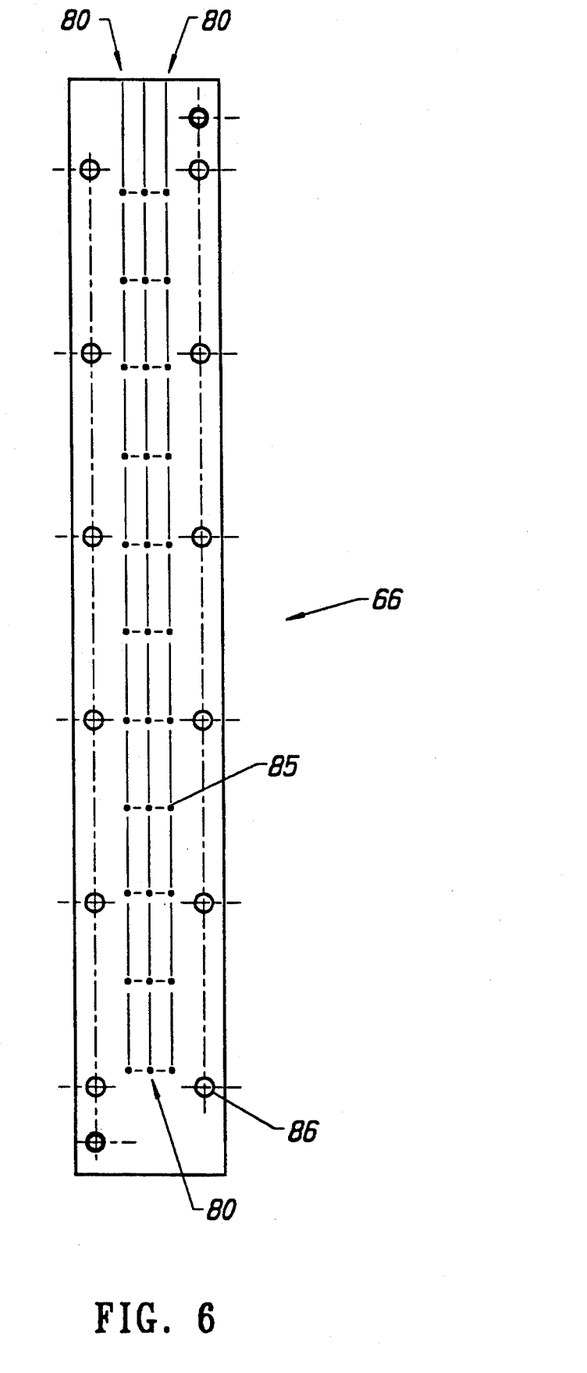
FIG. 6 is a plan view of the bottom surface of the top plate of the injector shown in FIG. 4.

Thus, in the present embodiment, three delivery lines 35 convey three gaseous chemicals to the first plate 66. Each chemical is individually conveyed through the plate by a passage 76, a plenum 78, and an linear hole array 80. The linear hole arrays 80 of the first plate convey the gases to the second plate 68.

Figure 7:
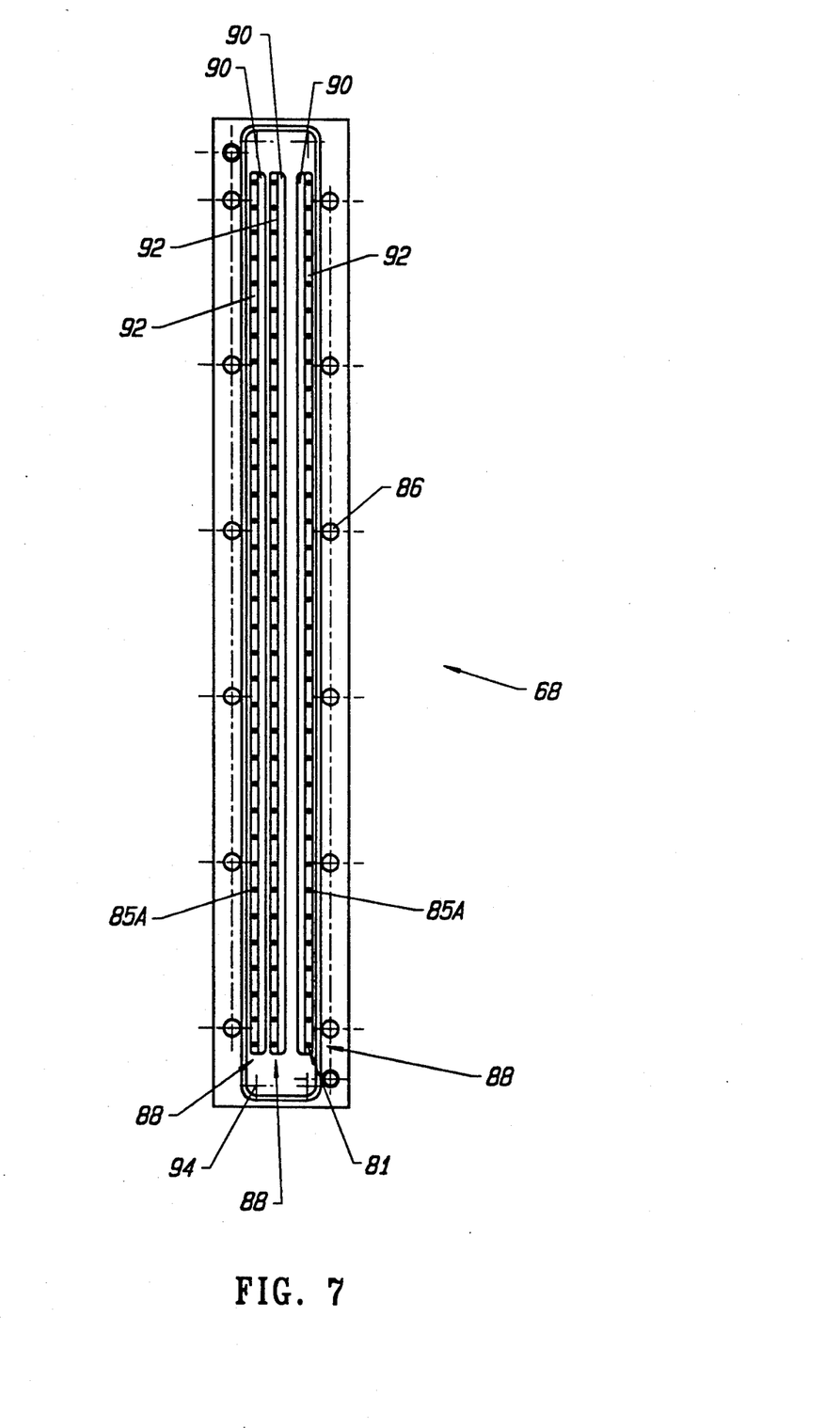
FIG. 7 is a plan view of the top surface of the middle plate of the injector shown in FIG. 4.

FIG. 7 depicts the top surface of the second plate 68 which is aligned with and attached to the bottom of the first plate 66. More particularly, the three linear hole arrays 80 at the bottom of the first plate 66 are positioned over and aligned with slot 90, which is aligned directly beneath a hole array 80 from the first plate 66. The slot 90 leads to a trough 92. At the bottom of each trough is another linear hole array 81.

Note that in this embodiment, each linear hole array 81 of the second plate 68 includes 34 holes 85A, a larger number of holes than in the top plate hole array. Each hole 85A is approximately 0.028 inches in diameter. Each slot 90 is approximately 0.125 inches long and 0.010 inches deep. Each trough 92 is approximately 0.125 inches in diameter and 0.2 inches deep.

Figure 8:
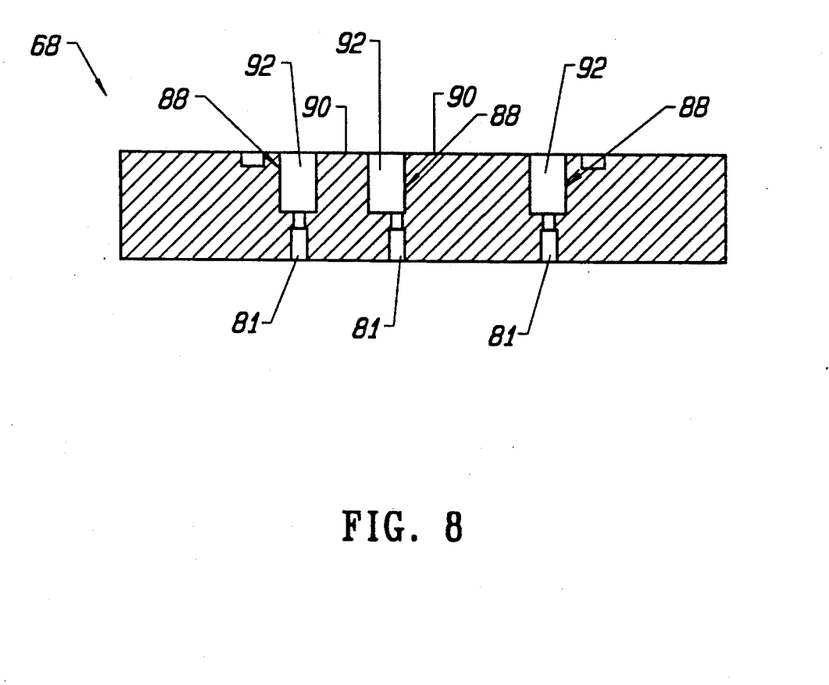
FIG. 8 is a cross-sectional view of the middle plate of the injector shown in FIG. 4.

The precise nature of this configuration is more fully appreciated with reference to FIG. 8. The figure depicts the cross-sectional width oriented view of the middle plate 68. The nature of the slot 90 and its relation to the trough 92 are more fully appreciated with reference to the figure.

Returning to FIG. 7, a few additional elements of the invention are depicted. Groove 94 surrounds the three inlet linear hole arrays 88 and is adopted to receive a sealing ring. The figure also depicts several fastening holes 86, used to attach the plates to one another.

Figure 9:
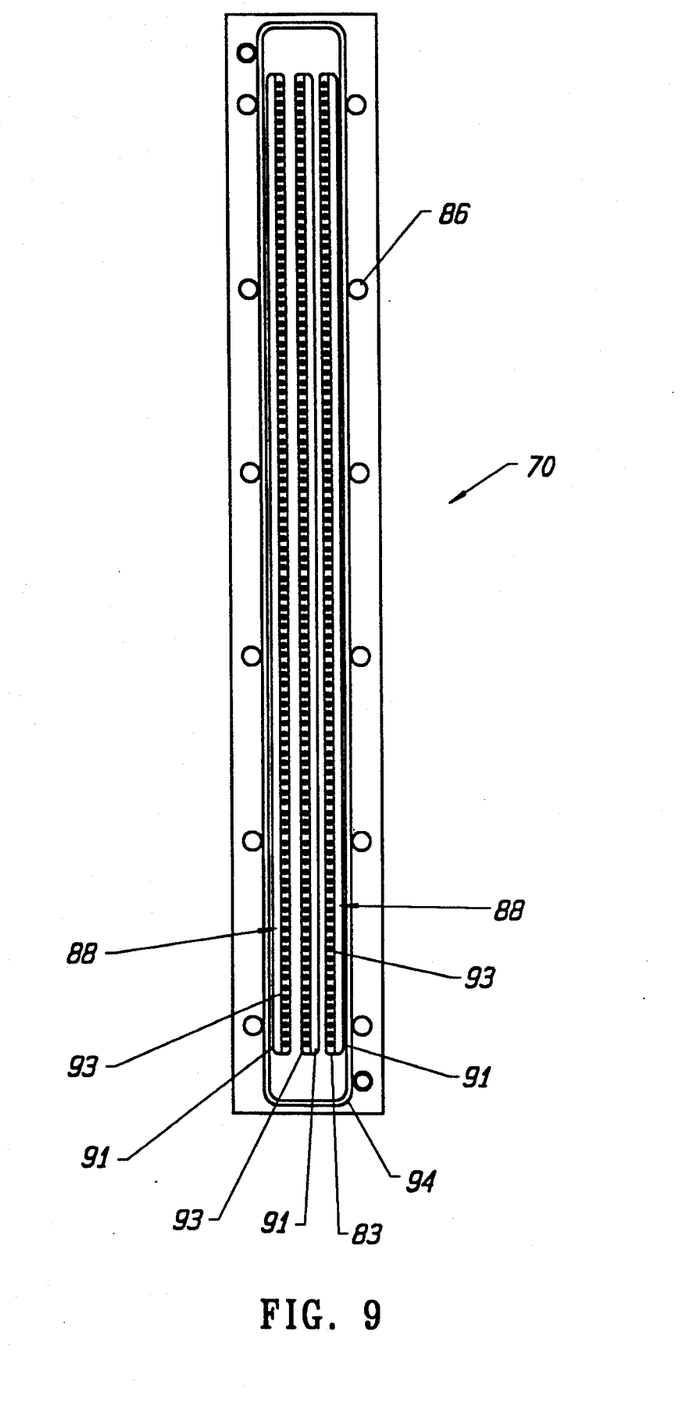
FIG. 9 is a plan view of the top surface of the bottom plate of the injector shown in FIG. 4.

Referring to FIG. 9, the top surface of the bottom plate 70 is depicted. The three linear hole arrays 81 at the bottom of the second plate 68 are positioned over the three slots 91. As before, each slot 91 leads to a trough 93, which in turn leads to a linear hole array 83, positioned at the base of the trough 93.

Figure 10:
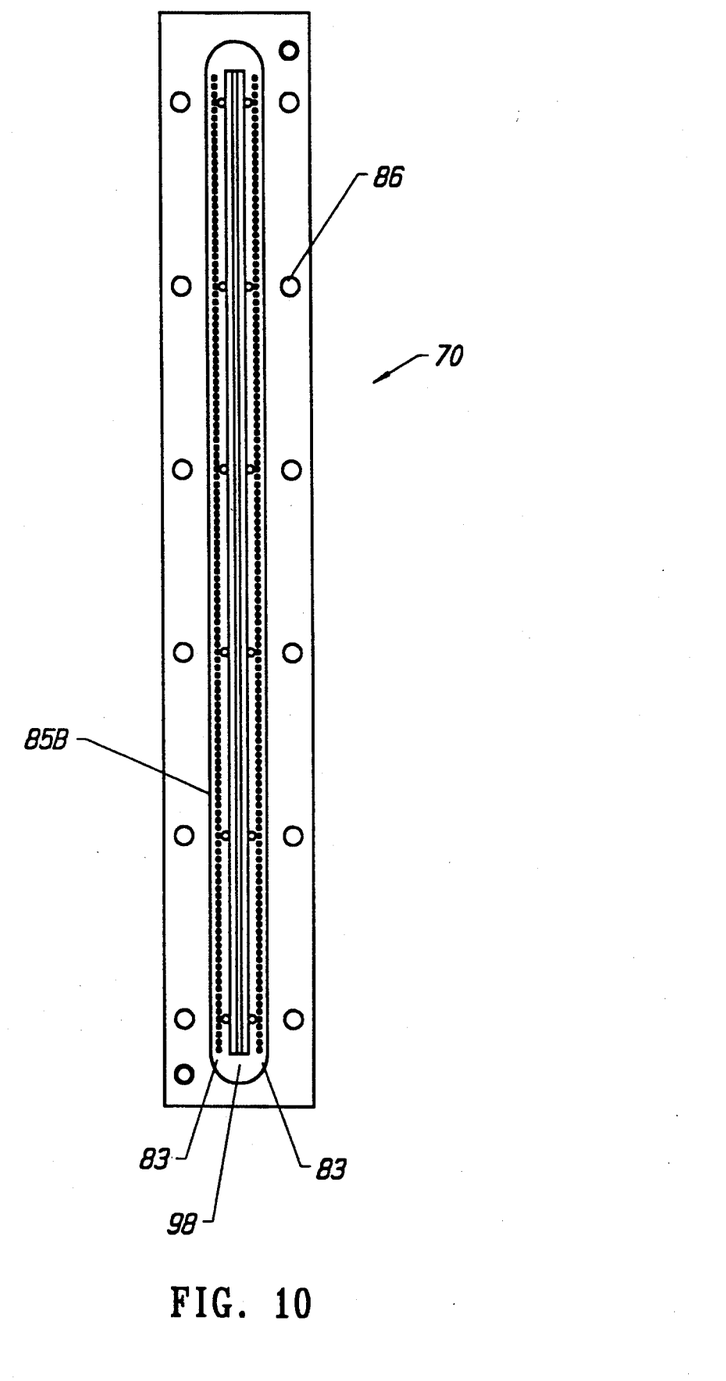
FIG. 10 is a plan view of the bottom surface of the bottom plate of the injector shown in FIG. 4.
Figure 11:
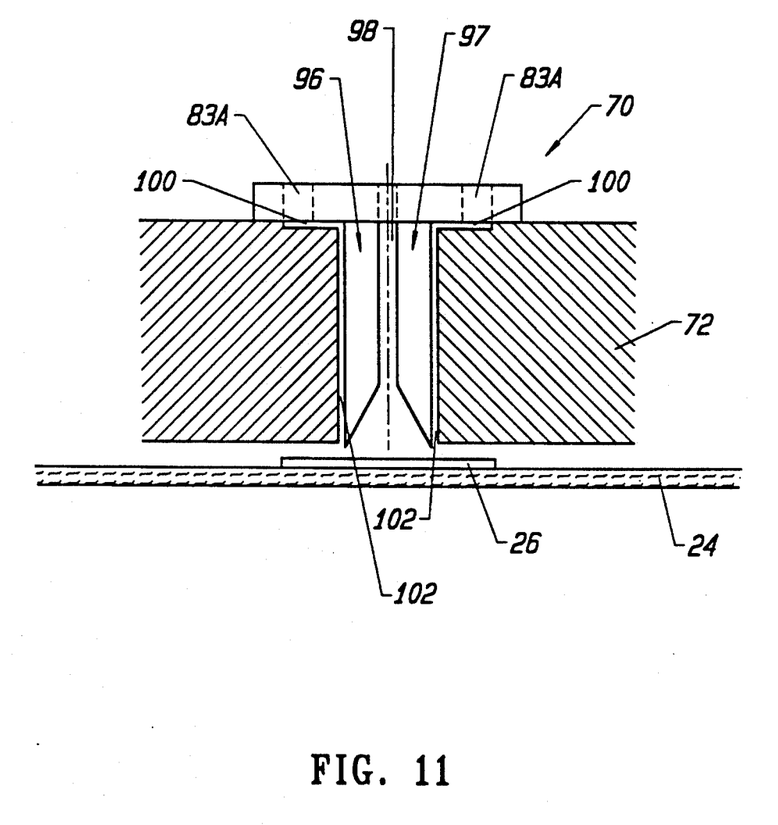
FIG. 11 is an enlarged partial side view of the chute of the injector.

The three linear hole arrays 83 of the third plate 70 lead to chute 96, as depicted in FIGS. 4 and 11. The connection between these linear hole arrays 83 and the chute 96 is more fully appreciated with reference to FIG. 10. The figure depicts the bottom surface of the bottom plate 70 which includes two linear hole arrays 83 and a central passage 98. Each linear hole array 83 includes 133 holes 85B, each hole 85B is approximately 0.020 inches in diameter.

Returning to FIG. 11, depicted therein is a cross-sectional view of the chute 96, chute walls 97 defining the central passage 98, and two linear hole arrays 83A (in communication with the linear hole arrays 83 of the third plate 70). The chute 96 is surrounded by cooling plate 72, the region therebetween forming slots 100 and ducts 102. Chute walls 97 continue to partition the individual gases. The gases are finally free to interact at the base of the chute 96, which is approximately ¼ inch above the surface of the wafer substrate 26. The chute 96 is about 0.725 inches from top to bottom.

In sum, in the particular embodiment disclosed, the three delivery lines 35, of the chemical delivery system 34, are attached to three passages 76 of the top plate 66. The delivery lines 35 may, for instance, convey tungsten hexa-fluoride in one line and nitrogen and hydrogen in the other two to realize a blanket tungsten coating.

Whatever gases are involved, each of them discretely proceeds through a plenum 78, and a first plate linear hole array 80. Each gas then proceeds through the second plate 68 which includes a second plate slot 90, a second plate trough 92, a second plate linear hole array 81 which includes more holes than the first plate linear hole array 80. Each gas then proceeds through the third plate 70 which includes a third plate slot 91, a third plate trough 93, and a third plate linear hole array 83 which includes more holes than the second plate linear hole array 81. At the bottom of this third plate is the chute 96. The gases' input into one of the delivery lines 35 is conveyed through the passage 98, while the gases fed into the other two delivery lines 35 are conveyed through the ducts 102. At the bottom of the chute 96, the three gases are free to react with one another.

Consequently, in this particular embodiment of the invention, the three gases may be viewed as discretely flowing through cascaded hole arrays. The cascaded hole arrays include three distribution stages (each distribution stage being a plate). More particularly, each cascaded hole array includes the sequence of elements set forth in the previous paragraph. Particularly noteworthy is the fact that each cascaded hole array includes a number of linear hole arrays and as the gases cascade down the cascaded hole arrays they encounter a linear hole array with more holes. This feature leads to a laminar-like chemical flow. This laminar-like flow is enhanced by the series of slots, troughs, and other features disclosed in this particular embodiment.

Through this cascading action, the individual gases achieve a laminar-like flow heretofore unknown in the art. This resultant flow lends itself to improved interaction between the gases when they finally interact. Moreover, this improved chemical flow leads to more uniform and precise layer or film on the wafer or substrate.

Thus, it is apparent that there has been provided an injector and method for delivering gaseous chemicals to a surface that fully satisfies the objects, aims, and advantages set forth above.

While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and scope of the appended claims.

What is claimed is:

1. An injector including a plurality of contiguous, consecutive chemical vapor distribution stages, each of said stages including a plurality of distribution channels leading to corresponding linear hole arrays, each of said stages serving to discretely receive a plurality of gases, each of said gases at each of said stages being diffused by said linear hole arrays, whereby said gases flow through said distribution stages and become increasingly laminar and uniform over an extended length.

2. The apparatus of claim 1 wherein said injector includes first, second, and third distribution stages, each of said stages including a plurality of linear hole arrays.

3. The apparatus of claim 2 wherein said first distribution stage includes a plurality of distribution channels, each of said distribution channels including a conduit and a plenum leading to a linear hole array.

4. The apparatus of claim 2 wherein said second distribution stage includes a plurality of distribution channels, each of said distribution channels including a slot and a trough leading to a linear hole array.

5. The apparatus of claim 2 wherein said third distribution stage includes a plurality of distribution channels, each of said distribution channels including a slot and a trough leading to a linear hole array.

6. The apparatus of claim 2 wherein said linear hole arrays of said third distribution stage include more holes than said linear hole arrays of said second distribution stage which include more holes than said linear hole arrays of said first distribution stage.

7. An injector, for uniformly depositing films or layers to a surface of a wafer or substrate, comprising:
a first plate including a first multiple stage distribution channel;
a second plate, positioned directly beneath and aligned with said first plate, including a second multiple stage distribution channel;
a third plate, positioned directly beneath and aligned with said second plate, including a third multiple stage distribution channel;
a chute with a passage positioned beneath said third plate; and
a cooling plate positioned on both sides of said chute, the region between said chute and said cooling plate defining ducts, whereby said first plate receives a plurality of gases, each of said gases being individually conveyed to said first multiple stage distribution channel, said first multiple stage distribution channel thereby discretely conveying each of said gases to said aligned second plate, said second multiple stage distribution channel thereby discretely conveying each of said gases to said aligned third plate, said third multiple stage distribution channel thereby discretely conveying each of said gases to said chute such that said passage and said ducts directly convey each of said gases to a region above said surface where said gases are exposed to one another, react, and form a layer on said surface.

8. The apparatus of claim 7 wherein said first multiple stage distribution channel, said second multiple stage distribution channel, and said third multiple stage distribution channel each include three discrete linear hole arrays.

9. The apparatus of claim 7 wherein said first multiple stage distribution channel of said first plate includes a conduit and a plenum leading to a linear hole array.

10. The apparatus of claim 9 wherein said second multiple stage distribution channel of said second plate includes a slot and a trough leading to a linear hole array.

11. The apparatus of claim 10 wherein said third multiple stage distribution channel of said third plate includes a slot and a trough leading to a linear hole array.

12. The apparatus of claim 11 wherein said linear hole array of said third plate includes more holes than said linear hole array of said second plate which includes more holes than said linear hole array of said first plate.

13. In an atmospheric pressure chemical vapor deposition apparatus for depositing films or layers on wafers or substrates, said apparatus including a conveyor belt, a muffle, and a coating chamber with a chemical delivery system, a chemical injector, and an exhaust system, said coating chamber being positioned within said muffle such that said conveyer belt delivers said wafers or substrates to said coating chamber whereby said chemical injector distributes chemical vapors over the surface of said wafer or substrate for reaction and resultant film deposition on the surface of said wafer or substrate, the improvement comprising an injector which includes:

a first plate including a plurality of discrete linear hole arrays, a conduit and a plenum leading to each of said first plate linear hole arrays;

a second plate including a plurality of discrete linear hole arrays positioned beneath and aligned with said first plate, a slot and a trough leading to each of said second plate linear hole arrays; and a third plate including a plurality of discrete linear hole arrays positioned beneath and aligned with said second plate, a slot and a trough leading to each of said third plate linear hole arrays, a chute including a passage positioned beneath said third plate, and a cooling plate positioned on both sides of said chute, the region between said chute and said cooling plate defining ducts, whereby each of said gases is individually conveyed to said conduits of said first plate, said conduits discretely conveying said gases to said plenums and said plenums conveying said gases to said slots, troughs, and aligned linear hole arrays of said second plate, said second plate linear hole arrays thereby discretely conveying each of said gases to said slots, troughs, and aligned linear hole arrays of said third plate, each of said third plate linear hole arrays discretely conveying each of said gases to said chute such that said passage and said ducts discretely convey each of said gases to a region above said surface where said gases are exposed to one another and react.

14. The improvement of claim 13 wherein said first, second, and third plates include three discrete linear hole arrays.

15. The improvement of claim 13 wherein said linear hole arrays of said third plate include more holes than said linear hole arrays of said second plate which include more holes than said linear hole arrays of said first plate.

* * * * *